(12) United States Patent
Herman et al.

(10) Patent No.: US 10,189,654 B2
(45) Date of Patent: Jan. 29, 2019

(54) TEST DEVICE FOR ESTABLISHING, VERIFYING, AND/OR MANAGING ACCURACY

(71) Applicant: UNIVERSAL INSTRUMENTS CORPORATION, Conklin, NY (US)

(72) Inventors: John William Herman, Binghamton, NY (US); John J. Pichura, Kirkwood, NY (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 29 days.

(21) Appl. No.: 15/317,813

(22) PCT Filed: Jun. 11, 2015

(86) PCT No.: PCT/US2015/035294
§ 371 (c)(1),
(2) Date: Dec. 9, 2016

(87) PCT Pub. No.: WO2015/191833
PCT Pub. Date: Dec. 17, 2015

(65) Prior Publication Data
US 2017/0129717 A1 May 11, 2017

Related U.S. Application Data

(60) Provisional application No. 62/010,519, filed on Jun. 11, 2014.

(51) Int. Cl.
*B65G 49/06* (2006.01)
*H05K 13/08* (2006.01)

(52) U.S. Cl.
CPC ....... *B65G 49/064* (2013.01); *H05K 13/0818* (2018.08); *B65G 2249/04* (2013.01)

(58) Field of Classification Search
CPC .............. B23K 26/0853; B23Q 3/1546; B25J 15/0608; B25J 15/0616; B25J 15/065;
(Continued)

(56) References Cited

U.S. PATENT DOCUMENTS

| 4,601,382 A | 7/1986 | Roberts |
| 4,620,663 A | 11/1986 | Odashima et al. |

(Continued)

FOREIGN PATENT DOCUMENTS

| CN | 106660715 A | 5/2017 |
| JP | 2000236195 A | 8/2000 |

(Continued)

OTHER PUBLICATIONS

International Search Report and Written Opinion for PCT Application No. PCT/US15/35294, dated Aug. 28, 2015.

(Continued)

*Primary Examiner* — Saul Rodriguez
*Assistant Examiner* — Brendan P Tighe
(74) *Attorney, Agent, or Firm* — Schmeiser, Olsen & Watts, LLP

(57) ABSTRACT

A test device is disclosed for verifying the accuracy of a pick and place process. The test device includes a surface configured to receive components, and a ferromagnetic layer located under the surface. A system is further disclosed including the test device and a plurality of components each including a magnetic element, the plurality of components configured to be received by a plurality of pockets of the test device. A method of picking and placing a component onto the test device is further disclosed.

16 Claims, 5 Drawing Sheets

(58) Field of Classification Search
CPC .. B25J 15/0675; B65G 17/46; B65G 2249/04; B65G 49/064; Y10T 279/23; H05K 13/0818
USPC ............ 221/211, 212; 269/8; 279/128; 335/285, 286, 287, 289, 295; 414/749.1
See application file for complete search history.

(56) References Cited

U.S. PATENT DOCUMENTS

| | | | |
|---|---|---|---|
| 4,776,088 A | | 10/1988 | Biggs et al. |
| 5,209,042 A | * | 5/1993 | Rickard ............... B65B 5/045 53/116 |
| 5,537,204 A | | 7/1996 | Woodhouse |
| 8,544,908 B1 | | 10/2013 | Lai |
| 2008/0110725 A1 | | 5/2008 | Allore |
| 2010/0229616 A1 | | 9/2010 | Fink et al. |
| 2011/0228080 A1 | | 9/2011 | Ding et al. |
| 2013/0222097 A1 | | 5/2013 | Fullerton et al. |

FOREIGN PATENT DOCUMENTS

| | | |
|---|---|---|
| WO | 98/42167 A2 | 9/1998 |
| WO | 2008/048027 A1 | 4/2008 |
| WO | 2015/191833 A1 | 12/2015 |

OTHER PUBLICATIONS

International Preliminary Report on Patentability for PCT Application No. PCT/US15/35294, dated Jun. 9, 2016.

Extended European Search Report and Search Opinion (dated Jan. 16, 2018) for European Patent Application No. EP 15 80 836—Filing Date: Dec. 23, 2016—(11 pages).

Chinese Office Action for Application No. 201580031275.4 (dated Jul. 4, 2018).

* cited by examiner

TEST DEVICE FOR ESTABLISHING, VERIFYING, AND/OR MANAGING ACCURACY

RELATED MATTERS

This application claims priority to PCT Application No. PCT/US15/35294, having a filing date of Jun. 11, 2015, which claims priority to provisional patent application No. 62/010,519 filed Jun. 11, 2014, and entitled "Self-contained Fixture for Establishing, Verifying and Managing Accuracy," the disclosures of which are hereby incorporated by reference.

TECHNICAL FIELD

The subject matter disclosed herein relates generally to techniques to establish, verify and/or manage the accuracy of a pick and place machine prior to real component placements. More particularly, the subject matter relates to a self-contained test device configured to reduce the time it takes to establish, verify and/or manage the accuracy of a pick and place machine.

BACKGROUND

In order to establish and verify machine accuracy before an actual assembly pick and place process with real component parts being placed on eventually functioning boards, it is common to place lithographically defined glass slugs on precision glass boards for the purpose of determining whether a machine is placing the slugs on the glass board at a proper location. This verifies that the machine will properly place real component parts. Double-sided tape is used for slug attachment. The double-sided tape strips are often applied to the precision glass boards in a lengthwise manner at the location(s) where placement will occur. Once the slugs are placed onto these location(s), the slugs are held by the double-sided tape.

This technique has several drawbacks. For example, the flatness and quality of the placement surface depends on tape quality of the double-sided tape as well as the application technique of the technician when applying the double-sided tape. Moreover, the double-sided tape may be prone to contamination such as glass shards that are occasionally produced in the removal of the slugs with a utility knife once the verification process is over. This may contaminate the glass board for the next verification process. Due to contamination and reduced adhesion from repeated use, the double-sided tape must be often removed and replaced. This entails removing the board from the machine, removing the tape, cleaning the board, and reapplying the tape. This can be a very time-consuming process.

Thus, a test device for establishing, verifying and managing accuracy of a pick and place machine prior to placement of real components would be well received in the art.

BRIEF DESCRIPTION

According to a first embodiment, a method comprises: picking a component with a pick and place nozzle of a pick and place machine, the component including a first magnetic element; and placing the component on a surface of a test device with the pick and place nozzle, the test device including a second magnetic element, wherein a vacuum holding force of the pick and place nozzle when holding the component exceeds a force of magnetic attraction between the first magnetic element and the second magnetic element after the component is placed on the surface.

According to a second embodiment, a test device for verifying the accuracy of a pick and place process is disclosed, the test device comprising: a surface configured to receive components; and a ferromagnetic layer located under the surface.

According to a third embodiment, a system comprises: a test device for verifying the accuracy of a pick and place process, the test device including a carrier portion and a surface configured to receive components and a magnetic layer located under the surface, the carrier portion including a plurality of pockets; and a plurality of components each including a magnetic element, the plurality of components configured to be received by the plurality of pockets.

BRIEF DESCRIPTION OF THE DRAWINGS

Some embodiments of this invention will be described in detail, with reference to the following figures, wherein like designations denote like members, wherein.

DETAILED DESCRIPTION

A detailed description of the hereinafter described embodiments of the disclosed apparatus and method are presented herein by way of exemplification and not limitation with reference to the Figures.

Figure 1:
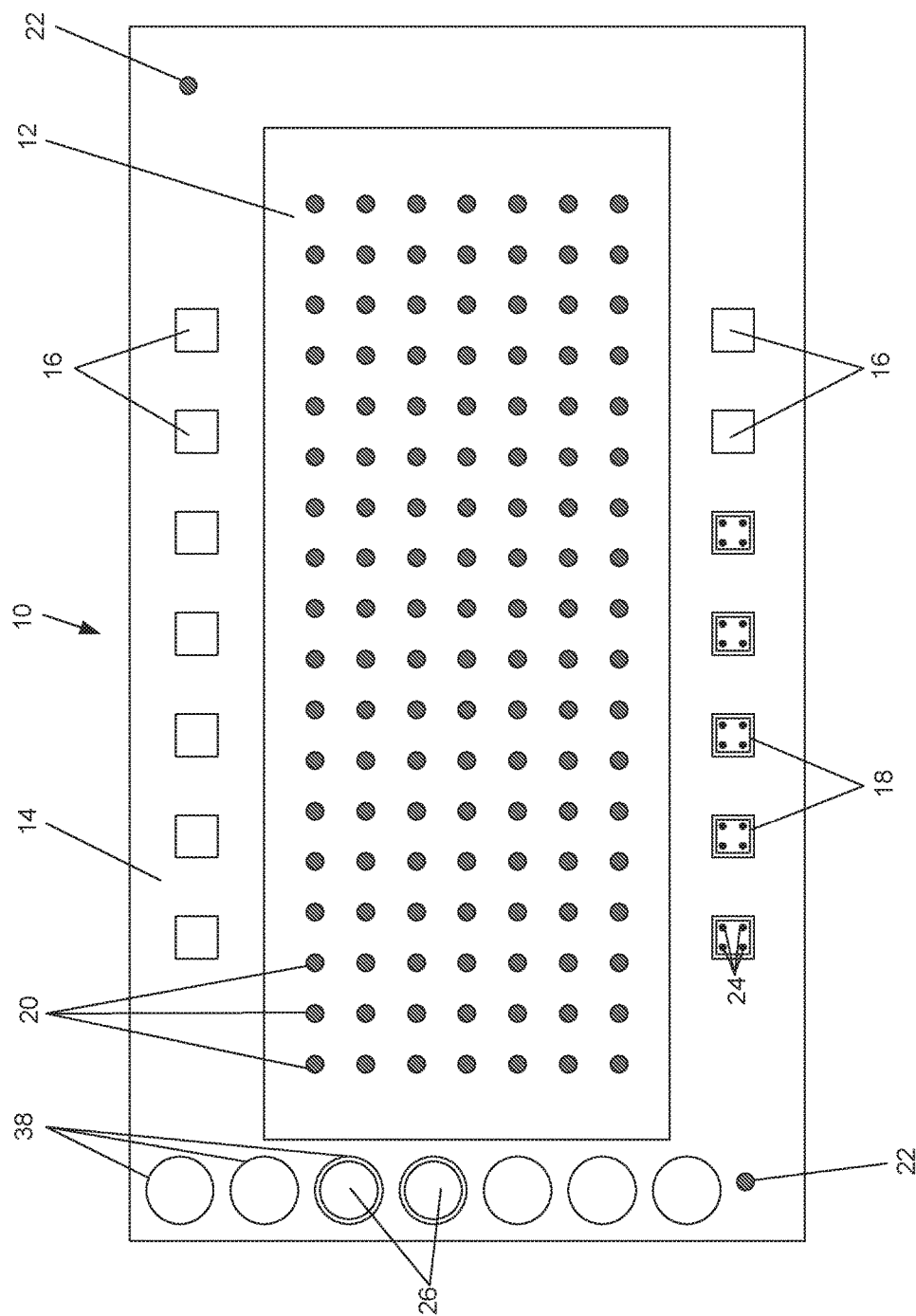
FIG. 1 depicts a top view of a test device in accordance with one embodiment.

Referring first to FIG. 1, a top view of a test device 10 is shown. The test device 10 includes a surface 12, and a carrier portion 14 located about the perimeter of the surface 12. Located in the carrier portion 14 is a plurality of pockets 16 within which a plurality of components 18 are located. A first plurality of fiducials 20 is located within the surface 12 of the test device 10. A second plurality of fiducials 22 is located on the carrier portion 14 of the test device 10. A third plurality of fiducials 24 (shown in FIG. 3) is located within an upward facing surface 19 (shown in FIG. 2) of the component 18. Further located in the carrier portion 14 of the test device 10 is a plurality of pockets 38 configured to receive a plurality of pick and place nozzles 26.

The test device 10 may be utilized to establish and verify machine accuracy of a pick and place machine 28 (shown in FIGS. 5-6) before the picking and placement of real or actual component parts being placed onto eventually functioning printed circuit boards (not shown). The testing using the test device 10 may be accomplished without the need for placing double-sided tape, or any other adhesive, glue or paste on the surface 12 of the device itself. This may allow the entire process of placing the components 18 on the surface, inspecting and verifying the accuracy of the placement by the pick and place machine 28, and removing the components 18 from the surface 12, to be completed within the pick and place machine 28 without operator intervention or involvement. In the embodiment shown, the test device 10 may be self-contained, in that the components 18 and the nozzles 26 utilized during a test process may be retained in the pockets 16, 38 in the carrier portion 14 on the test device 10 itself. In other embodiments, the test device 10 may not be self-contained, and one or both of the components 18 and/or the nozzles 26 used in a placement test process may not be retained on the test device 10 itself. The test device 10 may further be immediately reusable after a testing process without requiring manual intervention and removal of glass shards or re-taping.

Figure 2:
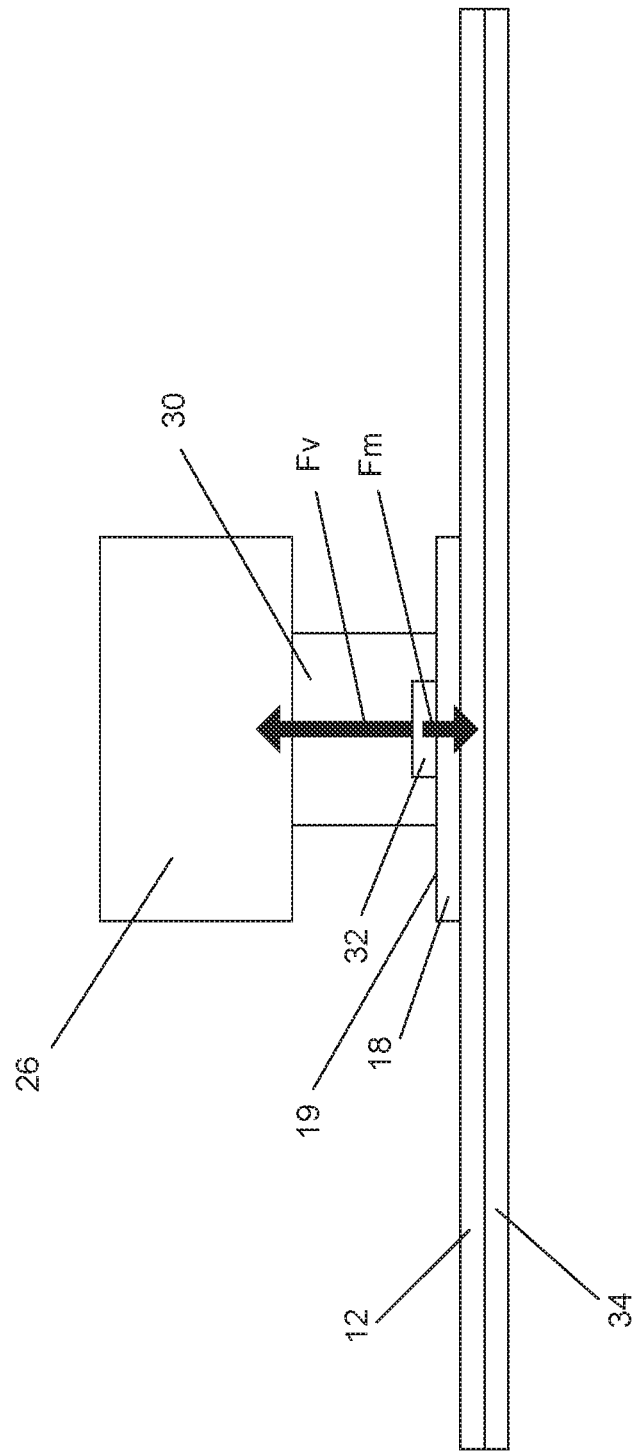
FIG. 2 depicts a side cutaway view side view of the test device of FIG. 1 with a nozzle placing a component in accordance with one embodiment.
Figure 6:
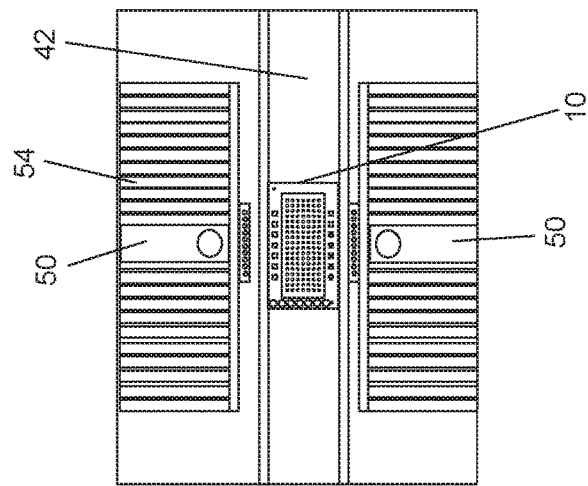
FIG. 6 depicts a top view of the test device of FIG. 1 located within the pick and place machine of FIG. 5 in accordance with one embodiment.
Figure 5:
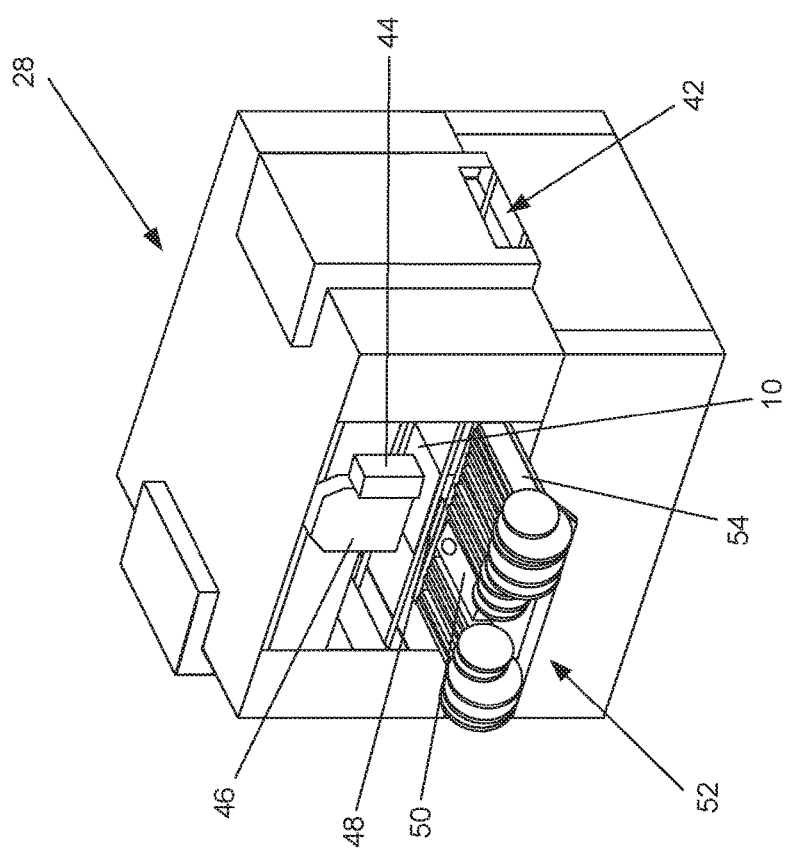
FIG. 5 depicts a perspective view of a pick and place machine having the test device of FIG. 1 located therein in accordance with one embodiment.

Referring to FIG. 2, a side view of the test device 10 is shown after the component 18 has been placed on the surface 12 by a pick and place nozzle 26 of a pick and place machine 28 (shown in FIGS. 5-6). The pick and place nozzle 26 may include a component interface portion 30 configured to contact and/or interface with the component 18. Further shown is a first magnetic element 32 included in the component 18. The first magnetic element 32 may be an integral or attached feature of the component 18. A second magnetic element 34 is shown located under the surface 12 of the test device 10. A vacuum holding force $F_v$ applied by the pick and place nozzle 26 on the held component 18 may exceed a force of magnetic attraction $F_m$ between the first magnetic element 32 and the second magnetic element 34 after the component 18 is placed on the surface 12. In one embodiment, the vacuum holding force $F_v$ may be at least 20% greater than the force of magnetic attraction $F_m$. In one embodiment, the vacuum holding force $F_v$ may be at least 30% greater, 40% greater, 50% greater, 60% greater, 70% greater, 80% greater, 90% greater or 100% greater than the force of magnetic attraction $F_m$. The relative value of the force of magnetic attraction $F_m$ may even be 150% or 200% greater than the value of the vacuum holding force $F_v$.

The test device 10 may retain the components 18 in their placed positions on the surface 12 with the magnetic force $F_m$. As described hereinbelow, other embodiments of the test device 10 are contemplated which do not use magnetism, but may instead use other means to hold the testing components 18 on the surface 12 of the test device 10. It should be understood that the components 18 may not be actual or real electronic components. Instead, the components 18 may be slugs or fake components that may include similar or the same dimensions as the real component that will eventually be placed in an actual assembly pick and place process. The components 18 may be provided with the test device 10 in a kit or package. The dimensions of the components 18 shown in the Figures are all the same. However, in other embodiments, the test device 10 may include components 18 of differing dimensions and shapes. The components 18 may be slugs, chips, pieces, parts, or the like. The components 18 may be made from glass, plastic, metal or the like. Any material is contemplated. In other embodiments, the components 18 may be made from a ferromagnetic material. In this case, the components 18 may not include a separate ferromagnetic element such as the first magnetic element 32, since the entirety of the component 18 may be made from the ferromagnetic material.

In one embodiment, the surface 12 may be made of glass. In other embodiments, the surface 12 may be made of plastic, ceramic, metal or a composite. In one embodiment, the surface 12 may be transparent, semi-transparent or translucent to facilitate imaging or inspection via a camera or imaging system located under the surface 12. In other embodiments, the surface 12 may be made from multiple materials. For example, the surface 12 may be made predominantly from glass, the glass surrounding an array of ferromagnetic material embedded within the glass in the shape of a grid, lattice, web, or other form. In yet other embodiments, the surface 12 may actually be made of the ferromagnetic material. Thus, rather than having two separate layers comprising the surface 12 and the second magnetic element 34 layered together as shown in FIG. 2, the test device 10 may be made from a single magnetic layer (not shown).

In the embodiment shown, the second magnetic element 34 is located as a layer under the surface 12. The second magnetic element 34 may be made from a ferromagnetic material. The second magnetic element 34 may be a layer that extends across the entirety of the surface area of the surface 12. In other embodiments, less magnetic material may be utilized if the second magnetic element 34 is shaped in a grid, mesh or other pattern, thereby not covering the entirety of the area under the surface 12. The grid, mesh or pattern may have bars that are spaced close together to to enable magnetic placement of small components at any location on the surface 12 of the component 18 with relatively equal magnetic force between the first magnetic element 32 and the second magnetic element 34. In other embodiments, the second magnetic element 34 may be electromagnetic instead of ferromagnetic. In this embodiment, the pick and place machine 28 may be configured to power the electromagnetic second magnetic element 34 during placement, testing and/or general operation of the testing device 10.

In the embodiment shown, the second magnetic element 34 may be permanently attached to the surface 12. For example, the second magnetic element 34 may be adhered to the surface 12 with a glue or epoxy. In another embodiment the second magnetic element 34 may be otherwise attached to the surface 12 by bolts, screws, or the like. In still other embodiments, the second magnetic element 34 may be removable from the surface 12. The removal of the second magnetic element 34 from the surface 12 may allow for inspection from under the surface 12 by the pick and place machine 28.

The strength of the magnetic field of the first and second magnetic elements 32, 34 may be dependent upon the thickness of the surface 12, and the force of the vacuum of the pick and place nozzle 26. Thus, the thicker the surface 12, the greater the strength of the magnetic field of the first and second magnetic elements 32, 34. As described above, the magnetic attraction $F_m$ between the first magnetic element 32 and the second magnetic element 34 may be less than the strength of the vacuum force $F_v$ of the pick and place nozzle 26. This may allow for the pick and place nozzle 26 to properly place the component 18 without the magnetic attraction between the second magnetic element 34 and the first magnetic element 32 impacting the placement process. Thus, the component 18 may remain firmly attached to the nozzle 26 until the nozzle 26 stops applying the vacuum force on the component 18. The magnetic attraction that the component 18 will have to the surface 12 as a result of the first and second magnetic elements 32, 34, i.e. $F_m$, may thereby not impact the placement or move the component 18 on the nozzle 26 when the vacuum force $F_v$ is being applied on the component 18 by the nozzle 26.

The test device 10 is shown including the carrier portion 14 in the embodiment shown. The carrier portion 14 may be made from metal in one embodiment. In other embodiments, the carrier portion 14 may be made from plastic, a composite, wood, or glass. However, because the carrier portion 14 will not receive placed components, the carrier portion 14 may not be required to be made of glass or other polished or smooth surface. The carrier portion 14 may surround the outer perimeter of the placement surface 12. In other embodiments, the carrier portion 14 may only be located proximate one or more edges of the surface 12.

The pockets 16 for the components 18 are shown in the embodiment to each be the same size and have the same dimensions. However, it should be understood that the pockets may be dimensioned differently in order to receive differently dimensioned components 18. In other embodiments, the pockets 16 may have a standard or uniform dimension, which may be large enough to accommodate any sized component 18. The pockets 16 may each include a ferromagnetic material located at the bottom or underneath the pocket 16. This may provide for a magnetic attraction between the components 18 and their respective pockets 16. This may help retain the components 18 within their respective pockets 16 during the moving of the test device 10 into the pick and place machine 28. Like the magnetic attraction $F_m$ between the first and second magnetic elements 32, 34, the force of magnetic attraction between the component 18 and the pockets 16 may be less than the vacuum force $F_v$ of the nozzle 26.

The test device 10 may further include the plurality of pockets 38 for holding a plurality of the pick and place nozzles 26. The pick and place nozzles 26 may be typical pick and place nozzles common in the electronic component placement industry. The test device 10 may be configured to hold a plurality of different types of pick and place nozzles. These nozzles 26 may each be configured to pick up a different type or size component. Thus, the sizes and shapes of the component interface portions 30 of the nozzles 26 may be different for each nozzle to accommodate different components. It should be understood that the methods and devices described herein may be applied to any sized nozzle and component.

FIG. 5 depicts an embodiment of the pick and place machine 28. It should be understood that the pick and place machine 28 is shown as an exemplary embodiment and that other embodiments having additional or different components are contemplated. The following description of the pick and place machine 28 is one example of the type of machine that may utilize the test device 10. The pick and place machine 28 shown in the Figures may comprise at least one feeder system 52. The feeder system 52 may include one or a plurality of feeders 54, that may contain, or be loaded with, electronic components (not shown) that may ultimately be positioned on a printed circuit. It should be understood that the components 18 described hereinabove with respect to the test device 10 may be slugs or test components which may correspond to real components that will eventually be utilized in a board placement process. It should be understood that the pockets 16 for the components 18 in the test device 10 may achieve the same purpose as the feeder system 52 by storing a plurality of components 18 used by the pick and place system 48 during testing. As such, the feeder system 52 may or may not be utilized when the test device 10 is in use. In embodiments where the test device 10 does not include the pockets 16 for the components 18, it should be understood that the feeder system 52 may be utilized in combination with the test device 10 during testing.

Furthermore, the embodiments of the pick and place machine 28 may include at least one pick and place system 46. The pick and place system 46 may comprise the pick and place nozzle 26 (shown in FIG. 2). In addition to the functionality described hereinabove with respect to picking up and placing the component 18, the nozzle 26 may further be configured to hold an electronic component during a board placement process and be configured to quickly pick, or select components from a feeder 54 of the feeder system 52. Moreover, the pick and place system 46 may be configured to seize a picked component, such as one of the components 18 or an electronic component, and move to place the component in a precise location on the test device 10 or, after testing is complete and accuracy is verified, onto a printed circuit board. In addition, the pick and place system 46 may be configured to pick and place a plurality of components on the test board 10 or a printed circuit board during a single pick and place sequence or multiple pick and place sequences. For example, the pick and place system 46 may include a spindle device or other mechanism having a plurality of nozzles, such as the nozzles 26 each operable to pick and place electronic components.

Embodiments of the pick and place machine 10 may include a vision detection system. The vision detection system may comprise a first camera 44 and a second camera 50, which may image the components 18 or an electronic component both prior to and after placement on to the test device 10 or a printed circuit board. It should be understood from the Figure that the second camera 50 may be configured to review the location of the picked component on the pick and place nozzle from below after the component has been picked up by the nozzle. Contrastingly, the first camera 44 is facing downward and may be configured to capture an image of the component after it has been placed on the surface 12 of the testing device 10 or on an actual board during an assembly process for an eventually functioning board. From the obtained image, a processor (not shown) may verify the accuracy of the location of the placed component captured by the first camera 44. The processor may also be configured to determine whether or not the component is placeable or not and the relationship of the component to the pick and place system 46 and the pick and place nozzle 26. For example, if the pick and place nozzle 26 of the pick and place system 46 has picked up one of the components 18 such that the location of the component 18 with respect to the nozzle 26 is not proper, the second camera 50 may capture this improper location and the processor may determine that the component 18 is not placeable and instruct the pick and place system 46 to realign the component 18 with respect to the nozzle 26. Additionally, the vision detection system and the processor may verify and/or manage the accuracy of the placement of the components 18 or the electronic components in the eventual board placement process in addition to the testing process.

Still further, embodiments of the pick and place machine 28 may be configured with one or more nozzle changer systems in the pick and place system 48. A nozzle changer system 48 may store and manage additional nozzles that may be provided either for the replacement of a damaged or contaminated nozzle or for the exchange of one nozzle for another nozzle to accommodate various component holding needs. It should be understood that the pockets 38 for the pick and place nozzles 26 in the test device 10 may achieve the same purpose as the nozzle change system 48 by storing a plurality of nozzles 26 used by the pick and place system 48 during testing. As such, the nozzle changer system 48 may or may not be utilized when the test device 10 is in use. In embodiments where the test device 10 does not include the pockets 38 for the nozzles 26, it should be understood that the nozzle changer system 48 may be utilized in combination with the test device 10 during testing.

Even further still, the embodiments of the pick and place machine 28 may also include at least one board handling system 42 configured to transport the test device 10, or a printed circuit board in the case that the machine is operating to place electronic components on a printed circuit board, through the pick and place machine 28. Embodiments of the board handling system 42 may also include a transport belt upon which the test device 10, or printed circuit board, may ride while being transported through the pick and place machine 10. The test device 10, or printed circuit board, may transfer into, or enter the pick and place machine 10 via board handling system 42, to a position within the pick and place machine 28, such as the approximate center of the pick and place machine 28, where a separate mechanism (such as a clamp or other fastening device) may secure the test device 10, or a printed circuit board, and hold it in position. Thus the clamp, or other fastening device may serve as a means for clamping the test device 10, or printed circuit board, in the pick and place machine 28. Once the testing of the pick and place process is complete, the clamp or other fastening device, may release the test device 10, or printed circuit board, which then may transfer out of the pick and place machine 28 via the board handling system 42.

Figure 3:
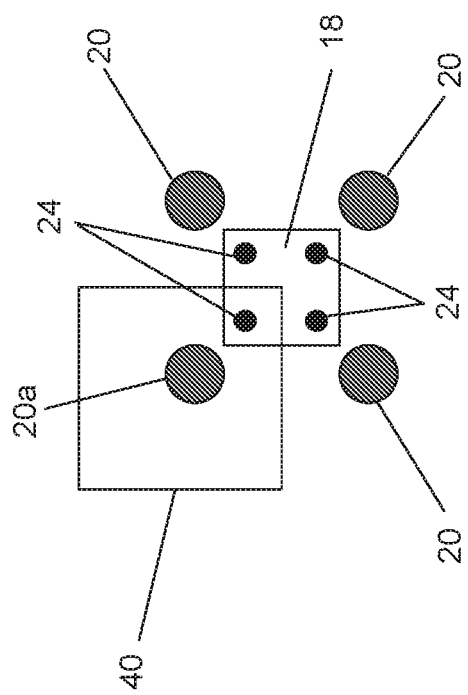
FIG. 3 depicts top schematic view of a camera area of interest relative to a component in accordance with one embodiment.

Referring back to FIG. 3, the surface 10 and the component 18 may each include the respective fiducials 20, 24. The fiducials 20, 24 may be markings, spots, marks, shapes, or the like. Any marking that can be visually detected by the camera 44 is contemplated. The fiducials 20, 24 may be darker than the rest of the component 18 or surface 12 upon which they reside. In other embodiments, the fiducials 20, 24 may be lighter than the rest of the component 18 or surface 12 upon which they reside. The fiducials 20, 24 may facilitate and assist the vision detection system, including the first camera 44, in detecting the location of the component 18 on the surface 12. The components 18 are shown having four of the fiducials 24 each, one on each corner of the upward facing surface 19 of the component 18. The surface 12 is shown having a grid of evenly spaced fiducials 20. The grid includes eighteen fiducials by seven fiducials. However, more or fewer fiducials are contemplated. FIG. 3 displays that the fiducials 20, 24 may each be spaced such that a camera area of interest 40 of the first camera 44 may always pick up at least one of the component fiducials 24*a*, along with one of the surface fiducials 20*a*. This may allow the vision detection system to determine and verify the exact location of the component 18 with respect to the surface 12. It should be understood that the camera area of interest 40 may represent the total visual recognition location of the vision detection system provided by the first camera 44.

Fiducials 22 are also shown in FIG. 1 on the carrier portion 14 of the test device 10. These fiducials 22 may be configured to allow the vision detection system, and the first camera 44 to detect the location of the carrier portion 14 on the board handling system 42. While a single fiducial 22 is shown on each of the top side and bottom side of the carrier portion 14, more or fewer fiducials are contemplated to more easily determine placement of the test device 10.

Figure 4:
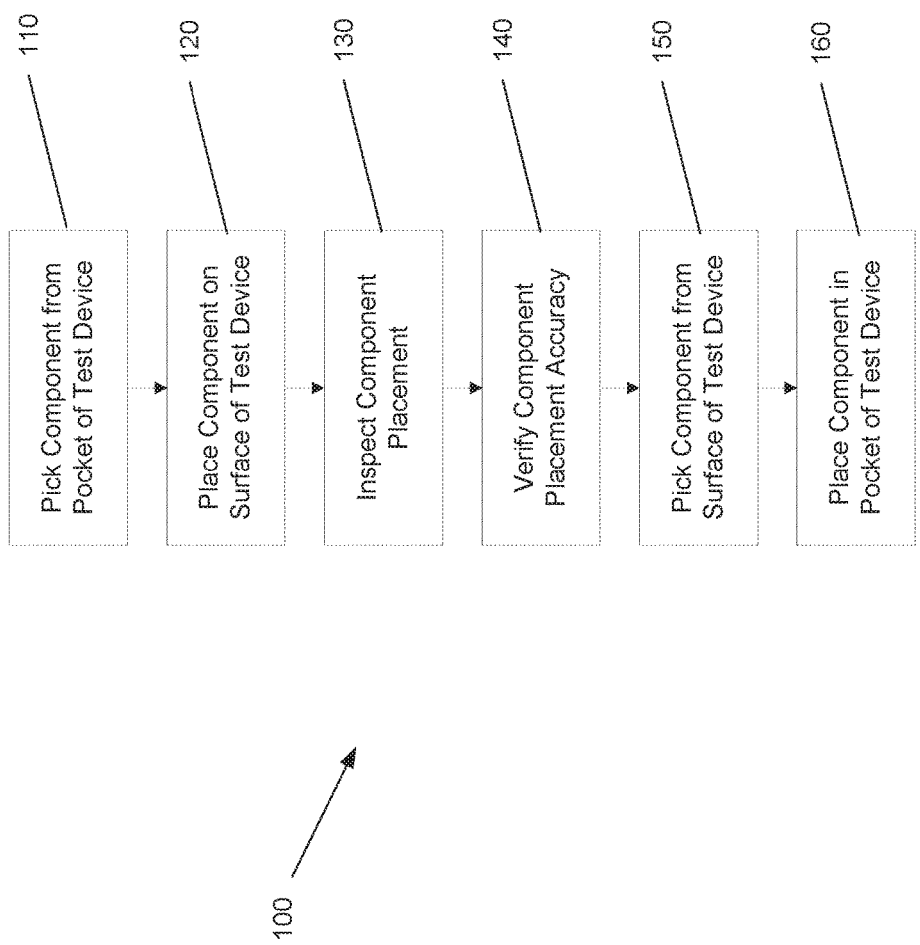
FIG. 4 depicts a flowchart of a method in accordance with one embodiment.

Referring back to FIG. 4, a method 100 of testing, establishing, verifying and/or managing accuracy of a pick and place machine, such as the pick and place machine 28, is shown. The method 100 includes a first step 110 of picking a component, such as the component 18, from a pocket, such as the pocket 16 of a test device, such as the test device 10. The first step 110 may be accomplished by a pick and place nozzle, such as the pick and place nozzle 26. The method 100 may include a second step 120 of picking the component on a surface, such as the surface 12, of a test device. This may further be accomplished by a pick and place nozzle. This step 120 may further include holding the component onto the surface with magnetic attraction. This may be accomplished by providing a magnet in the component and in or under the surface.

The method 100 may further include a third step 130 of inspecting the component placement. This step 130 may be accomplished by a vision detection system of a pick and place machine, the vision detection system including a camera such as the first camera 44. The method 100 may include a fourth step 140 of verifying the placement accuracy of the component on the surface. This may be accomplished by the vision detection system including a processor for making this determination. The third and fourth steps 130, 140 of the method 100 may be accomplished or completed while the surface remains within the pick and place machine without operator intervention or involvement. The third and fourth steps 130, 140 may include locating or finding fiducials, such as the fiducials 20, 22, 24, with the vision detection system and/or the camera and detecting the position of the surface within the pick and place machine, and detecting the position of the component on the surface.

The method 100 may still further include a fifth step 150 of picking the component back up off the surface with, for example, the pick and place nozzle. The method 100 may then include a sixth step 160 of placing or returning the component to the pocket of the test device after the steps 130, 140 of inspecting and verifying.

The method 100, still further, may include populating the surface with a plurality of components by performing the steps 110, 120 a plurality of times for a plurality of components. The method 100 may include inspecting the plurality of components on the surface with the vision detection system of the pick and place machine at the step 130 and verifying the accuracy of the placement of the plurality of components on the surface with the pick and place machine at the step 140. The method 100 may include performing the steps 150, 160 a plurality of times for a plurality of components to thereby return the plurality of components to a plurality of pockets in the carrier portion with the pick and place nozzle.

In another embodiment, a test device similar to the test device 10 may not include the second magnetic element 34. Instead, the test device in this embodiment may include a vacuum source for providing a force of attraction between the test device and the components 18. This vacuum source may be located under the test device in this embodiment. The surface of this test device may include a semi air permeable material that allows for a vacuum force to be applied on the surface. Like the embodiment described above, the vacuum force imposed on the component 18 by the surface of this test device may be less than the vacuum force $F_v$ of imposed on the component 18 by one of the nozzles 26 of the pick and place machine 28. In order to achieve this vacuum, the test device 10 may include a portable local vacuum source. This vacuum source may allow the board to be inspected with a third party metrology system. In still another embodiment, it is contemplated that another test device may include gecko-like materials for a vacuum and magnet-less target plate or surface. This type of material may be applied to the entirety of the surface and may be a dry adhesive which may emulate the setae found on the toes of a gecko. A dry adhesive such as this may be less sticky than double sided tape, may eliminate glass shards from remaining after removal, and may be easier to apply to the surface in the first place.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method comprising:
   picking a component with a pick and place nozzle of a pick and place machine, the component including a first magnetic element; and
   placing the component on a surface of a test device with the pick and place nozzle, the test device including a second magnetic element, wherein a vacuum holding force of the pick and place nozzle when holding the component exceeds a force of magnetic attraction between the first magnetic element and the second magnetic element after the component is placed on the surface, wherein the surface is made of glass, and wherein the second magnetic element is a ferromagnetic layer that is located under the surface.

2. The method of claim 1, further comprising inspecting the placed component on the surface with a vision detection system of the pick and place machine and verifying the accuracy of the placement of the component on the surface with the pick and place machine.

3. The method of claim 2, wherein the inspecting and the verifying are completed while the surface remains within the pick and place machine.

4. The method of claim 1, wherein the second magnetic element is electromagnetic, wherein the method further comprises providing power to the second magnetic element.

5. The method of claim 2, wherein the surface includes a plurality of fiducials, the method further comprising locating the fiducials with the vision detection system and detecting the position of the surface within the pick and place machine.

6. The method of claim 2, wherein the test device includes a carrier portion, the carrier portion located outside the perimeter of the surface, the carrier portion including a pocket configured to receive the component, the method further comprising picking from the pocket the component with the pick and place nozzle and returning, by the pick and place nozzle, the component to the pocket after the inspecting and verifying.

7. The method of claim 6, wherein the carrier portion includes a fiducial, the method further comprising finding the fiducial of the carrier portion with the vision detection system to facilitate picking the component from the pocket.

8. The method of claim 7, further comprising populating the surface with a plurality of components, inspecting the plurality of components on the surface with the vision detection system of the pick and place machine, verifying the accuracy of the placement of the plurality of components on the surface with the pick and place machine, and returning the plurality of components to a plurality of pockets in the carrier portion with the pick and place nozzle.

9. A method comprising:
   picking a component with a pick and place nozzle of a pick and place machine, the component including a first magnetic element;
   placing the component on a surface of a test device with the pick and place nozzle, the test device including a second magnetic element, wherein a vacuum holding force of the pick and place nozzle when holding the component exceeds a force of magnetic attraction between the first magnetic element and the second magnetic element after the component is placed on the surface; and
   inspecting the placed component on the surface with a vision detection system of the pick and place machine and verifying the accuracy of the placement of the component on the surface with the pick and place machine.

10. The method of claim 9, wherein the surface is made of glass, and wherein the second magnetic element is a ferromagnetic layer that is located under the surface.

11. The method of claim 9, wherein the inspecting and the verifying are completed while the surface remains within the pick and place machine.

12. The method of claim 9, wherein the second magnetic element is electromagnetic, wherein the method further comprises providing power to the second magnetic element.

13. The method of claim 9, wherein the surface includes a plurality of fiducials, the method further comprising locating the fiducials with the vision detection system and detecting the position of the surface within the pick and place machine.

14. The method of claim 9, wherein the test device includes a carrier portion, the carrier portion located outside the perimeter of the surface, the carrier portion including a pocket configured to receive the component, the method further comprising picking from the pocket the component with the pick and place nozzle and returning, by the pick and place nozzle, the component to the pocket after the inspecting and verifying.

15. The method of claim 14, wherein the carrier portion includes a fiducial, the method further comprising finding the fiducial of the carrier portion with the vision detection system to facilitate picking the component from the pocket.

16. The method of claim 15, further comprising populating the surface with a plurality of components, inspecting the plurality of components on the surface with the vision detection system of the pick and place machine, verifying the accuracy of the placement of the plurality of components on the surface with the pick and place machine, and returning the plurality of components to a plurality of pockets in the carrier portion with the pick and place nozzle.

* * * * *